US011500124B2

(12) United States Patent
Ramsay (10) Patent No.: US 11,500,124 B2
(45) Date of Patent: Nov. 15, 2022

(54) CONVERSION OF ROCK MECHANICS DATA FROM CONFINING STRESS TO PORE PRESSURE FOR RESERVOIR SIMULATORS

(71) Applicant: Landmark Graphics Corporation, Houston, TX (US)

(72) Inventor: Travis St. George Ramsay, Hockley, TX (US)

(73) Assignee: Landmark Graphics Corporation, Houston, TX (US)

(*) Notice: Subject to any disclaimer, the term of this patent is extended or adjusted under 35 U.S.C. 154(b) by 119 days.

(21) Appl. No.: 16/629,647

(22) PCT Filed: Nov. 14, 2017

(86) PCT No.: PCT/US2017/061457
§ 371 (c)(1),
(2) Date: Jan. 9, 2020

(87) PCT Pub. No.: WO2019/098988
PCT Pub. Date: May 23, 2019

(65) Prior Publication Data
US 2021/0405246 A1 Dec. 30, 2021

(51) Int. Cl.
*G01V 99/00* (2009.01)
*G06F 30/20* (2020.01)
(Continued)

(52) U.S. Cl.
CPC .......... *G01V 99/005* (2013.01); *E21B 49/00* (2013.01); *E21B 49/08* (2013.01); *G06F 30/20* (2020.01);
(Continued)

(58) Field of Classification Search
CPC ........ G01V 99/005; G01V 1/28; E21B 49/00; E21B 2200/20; E21B 49/08; G06F 30/20; G06Q 10/04; G06Q 10/0639; G06Q 50/02
(Continued)

(56) References Cited

U.S. PATENT DOCUMENTS 4,782,501 A 11/1988 Dixon, Jr.
5,058,012 A * 10/1991 Hinchman .............. E21B 49/00
702/12

(Continued)

FOREIGN PATENT DOCUMENTS

CN 102507407 A 6/2012
CN 104089823 A 10/2014
WO WO-2010047859 A1 * 4/2010 ............. G01V 11/00

OTHER PUBLICATIONS

Vasquez, Guilherme, et al. "Petroelasticity: Assessing Rock Properties under Stress through (Often) Non-Destructive Tests." 13th International Congress of the Brazilian Geophysical Society & EXPOGEF, Rio de Janeiro, Brazil, Aug. 26-29, 2013. pp. 1-6. (Year: 2013).*

(Continued)

*Primary Examiner* — John E Johansen
(74) *Attorney, Agent, or Firm* — Haynes and Boone, LLP (57) ABSTRACT

Systems and methods of the present disclosure are directed to reservoir simulation modeling using upon rock compaction tables derived from physical pore compressibility tests. The illustrative methods transform rock mechanics-based pore compressibility tests into compliant rock compaction tables for reservoir simulators using Dimensionless Stress to Pore Pressure Conversion, to thereby transfer geomechanical changes due to confining stress into expressions of geomechanical changes due to pore pressure.

15 Claims, 6 Drawing Sheets

(51) Int. Cl.
| | |
|---|---|
| E21B 49/00 | (2006.01) |
| G06Q 10/04 | (2012.01) |
| G06Q 10/06 | (2012.01) |
| G06Q 50/02 | (2012.01) |
| E21B 49/08 | (2006.01) |
| G01V 1/28 | (2006.01) |

(52) U.S. Cl.
  CPC ......... *G06Q 10/04* (2013.01); *G06Q 10/0639* (2013.01); *G06Q 50/02* (2013.01); *E21B 2200/20* (2020.05); *G01V 1/28* (2013.01)

(58) Field of Classification Search
  USPC .......................................................... 703/10
  See application file for complete search history.

(56) References Cited

U.S. PATENT DOCUMENTS

| | | | |
|---|---|---|---|
| 5,569,839 A | 10/1996 | Ajot et al. | |
| 2006/0131074 A1* | 6/2006 | Calhoun | E21B 49/006 175/50 |
| 2007/0276604 A1 | 11/2007 | Williams et al. | |
| 2012/0239298 A1 | 9/2012 | Morris et al. | |
| 2013/0192359 A1 | 8/2013 | Pelletier et al. | |

OTHER PUBLICATIONS

Mohiuddin, M., et al. "Stress-dependent porosity and permeability of a suite of samples from Saudi Arabian sandstone and limestone reservoirs." International symposium of the society of core analysts, Abu Dhabi. 2000. pp. 1-14. (Year: 2013).*

International Search Report and The Written Opinion of the International Search Authority, or the Declaration, dated Aug. 14, 2018, PCT/US2017/061457, 14 pages, ISA/KR.

Russell et al., "The Relationship Between Dry Rock Modulus and Porosity—An Empirical Study," *CREWES Research Report*, vol. 19, 2007.

Wolfe et al., "Log-Based Pore Volume Compressibility Prediction—A Deepwater GoM Case Study," *SPE Annual Technical Conference and Exhibition*, Oct. 9-12, 2005, Dallas, Texas, SPE-95545-MS.

* cited by examiner

CONVERSION OF ROCK MECHANICS DATA FROM CONFINING STRESS TO PORE PRESSURE FOR RESERVOIR SIMULATORS

PRIORITY

The present application is a U.S. National Stage patent application of International Patent Application No. PCT/US2017/061457, filed on Nov. 14, 2017, the benefit of which is claimed and the disclosure of which is incorporated herein by reference in its entirety.

FIELD OF THE DISCLOSURE

The present disclosure relates to reservoir simulation and, more specifically, to the conversion of rocks mechanics data obtained from pore compressibility tests into rock compaction tables for a reservoir simulator using Dimensionless Stress to Pore Pressure Conversion.

BACKGROUND

In the oil and gas industry, the most widely accepted workflow for executing production induced compaction studies would be to complete a coupled reservoir and geomechanics simulation that takes fluid and solid medium mechanics and displacement into consideration. However, such methods typically prove more financially burdensome and time intensive because disparate simulators or a single multiphysics simulator is involved. As a result, practitioners often negate the effects of coupled geomechanics in their modeling at the detriment of their capability to accurately predict the response of their asset to production. Alternatively, practitioners resort to incorporating pore volume and transmissibility multipliers as a function of pressure into reservoir simulation studies through rock compaction tables, as a pseudo-representation of structural subsurface changes caused by production. However, this approach does not capture the full physics from the interaction of structural and hydrodynamic phenomena which occur as a result of production from the reservoir.

DESCRIPTION OF ILLUSTRATIVE EMBODIMENTS

Illustrative embodiments and related methods of the present disclosure are described below as they might be employed in systems and methods to derive rock compaction tables from physical core compressibility tests for usage in reservoir simulation. In the interest of clarity, not all features of an actual implementation or method are described in this specification. It will of course be appreciated that in the development of any such actual embodiment, numerous implementation-specific decisions must be made to achieve the engineers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of this disclosure will become apparent from consideration of the following description and drawings.

As described herein, illustrative systems and methods of the present disclosure are directed to reservoir simulation models using rock compaction tables derived from physical core compressibility tests. The illustrative methods transform rock mechanics-based pore compressibility tests into compliant rock compaction tables for reservoir simulators using Dimensionless Stress to Pore Pressure Conversion ("DSPC"), to thereby transfer geomechanical changes due to confining stress into expressions of geomechanical changes due to pore pressure. The underlying assumption in developing the model transform from effects of confining stress (i.e., stress surrounding the rock on all sides) to those of pore pressure (i.e., outward pressure of fluid within pores of rock due to, e.g., fluid injection) is a completely linear elastic response of the porous media, so that changes in the pore space due to confining stress are proportional to changes in the pore space due to pore pressure.

In a generalized method of the present disclosure, rock mechanics data is obtained from one or more pore compressibility tests. The rock mechanics data is expressed as a function of confining stress. The rock mechanics data is then converted from a function of confining stress to a function of pore pressure using DSPC. Rock compaction tables are generated using the converted rock mechanics data. The rock compaction tables are input into a reservoir simulator to thereby execute a reservoir simulation model, which may be used to evaluate and/or forecast a variety of asset operations. Accordingly, the reservoir model simulates changes in the converted rock mechanics data generated as a function of confining stress into expressions of changes in the reservoir simulation due to pore pressure.

Illustrative embodiments and related methods of the present disclosure are described below in reference to FIGS. 1-5 as they might be employed in, for example, a computer system for reservoir simulation and data analysis. An illustrative reservoir simulator is the Nexus® Suite Reservoir Simulation platform, commercially available from Landmark Graphics Corp. of Houston, Tex. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only illustrative and are not intended to assert or imply any limitation with regard to the environment, architecture, design, or process in which different embodiments may be implemented.

Figure 1:
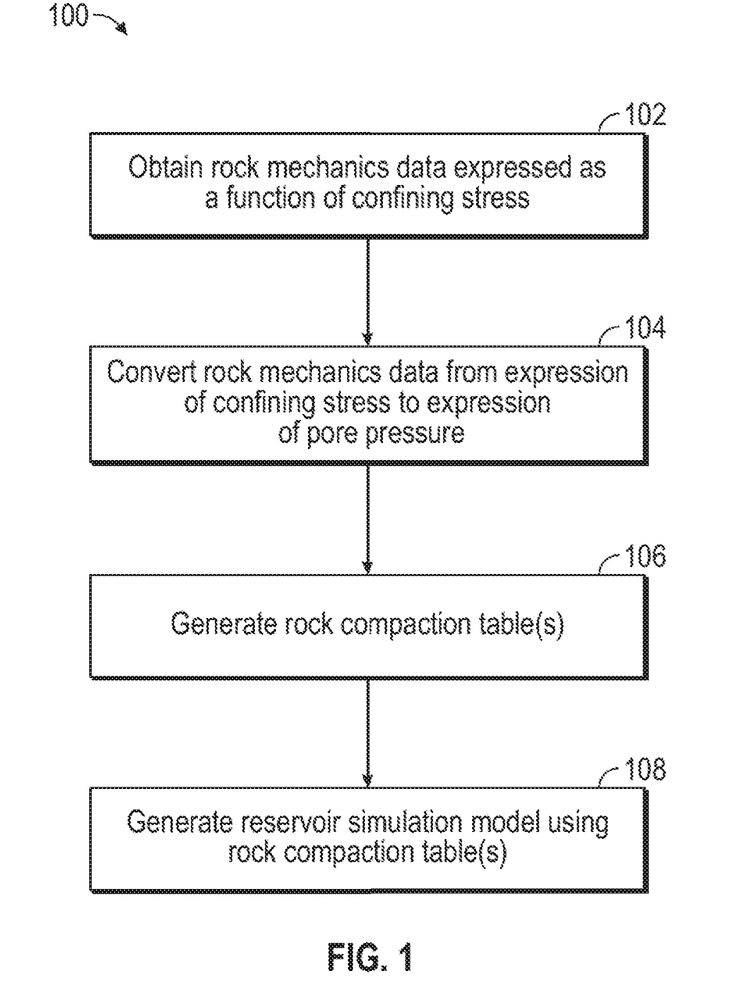
FIG. 1 is a flow chart of a generalized method for simulating a reservoir, according to certain illustrative embodiments of the present disclosure.

FIG. 1 is a flow chart of a generalized method for simulating a reservoir, according to certain illustrative embodiments of the present disclosure. At block 102 of method 100, rock mechanics data performed on cores is obtained by a computing system and expressed as a function of confining stress. The rock mechanics data may be obtained in a variety of ways, such as performing a pore volume compressibility test as a function of confining stress. In the test, the confining stress of a core is increased, then the porosity and permeability are measured at a given confining stress. At block 104, the computing system converts the rock mechanics data from the expressions of confining stress to expressions of pore pressure. As will be described in further detail below, the reservoir models provided herein take rock mechanics data performed on cores, which are measured at varying confining stresses, and defines a suitable transform to model the corresponding property multipliers as functions of pore pressure. At block 106, the computing system generates one or more rock compaction tables, which are then included in a reservoir simulation model in block 108. Thereafter, the generated reservoir model may be used to simulate and/or perform reservoir asset operations, such as the prediction of well production or the evaluation of production drive mechanisms.

The illustrative reservoir simulation models assumes constant pore space stiffness, and validation of the model may be performed by evaluating whether the modeled property multipliers, created as a function of pore pressure, converge into the same family of pore space/mineral bulk modulus ratios. Small differences in association between the measured and modeled data indicate a higher degree of model accuracy, while larger differences indicate poor model quality. As such, the models may be validated.

Figure 2:
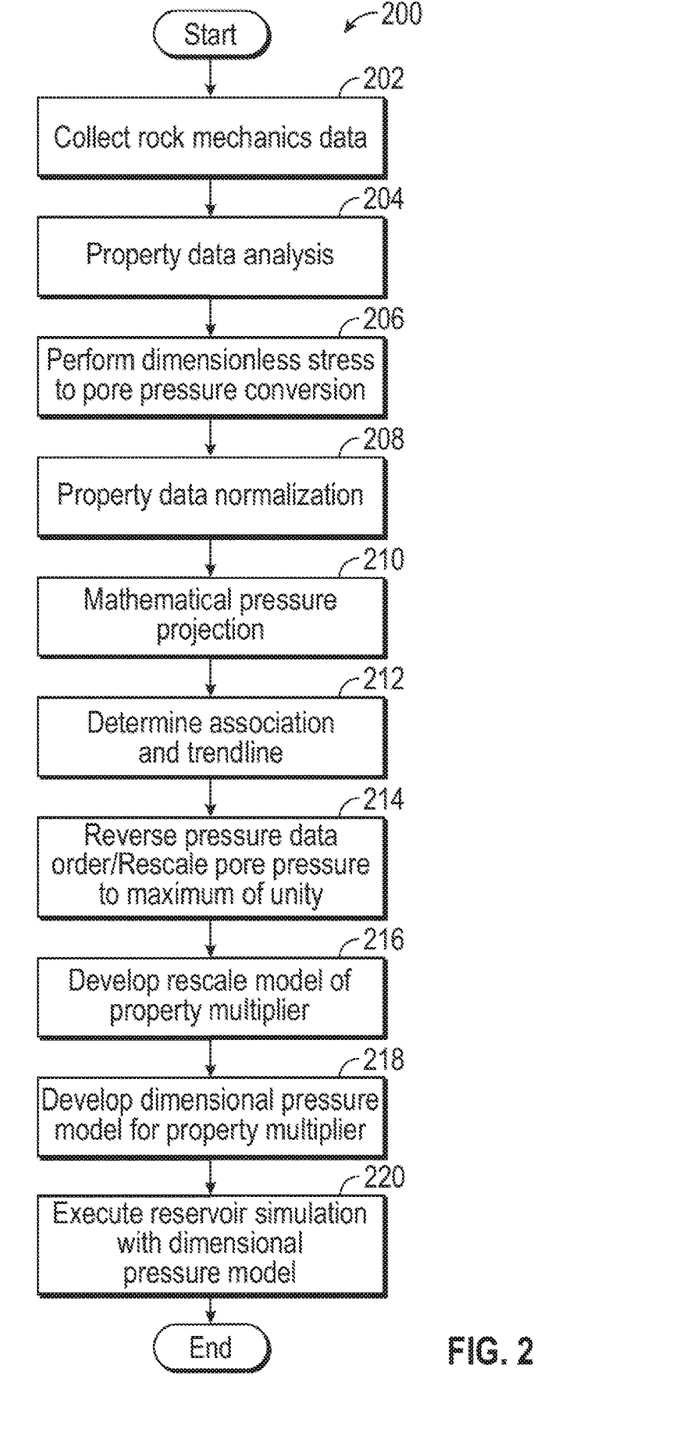
FIG. 2 is a flow chart of detailed method for simulating a reservoir, according to an illustrative embodiment of the present disclosure.
Figure 3A:
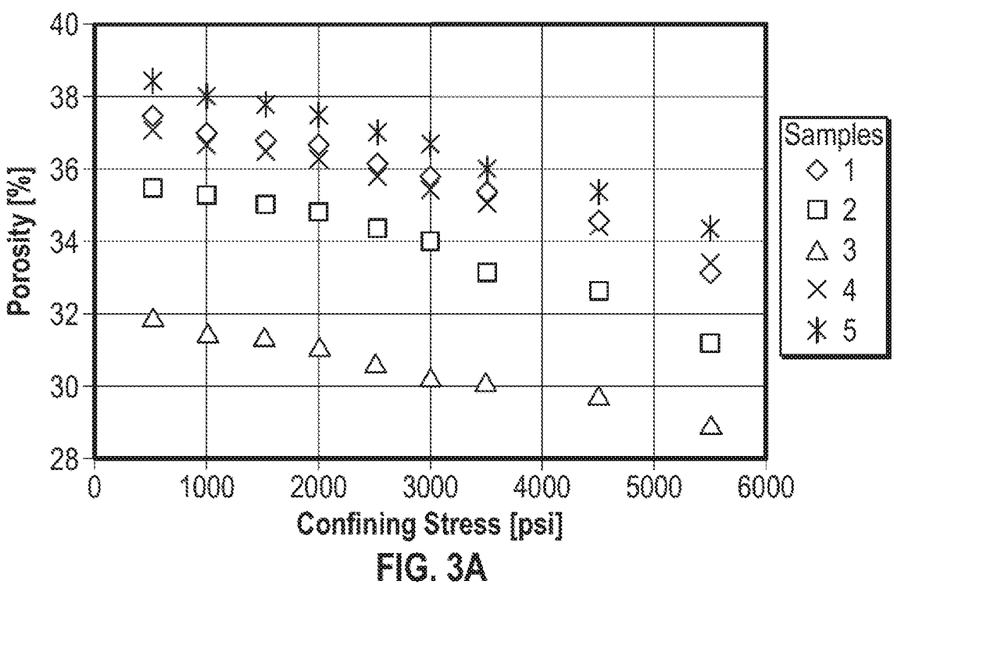
FIG. 3A is an illustrative graph showing changes in porosity as a function of confining stress for a number of rock samples.
Figure 3B:
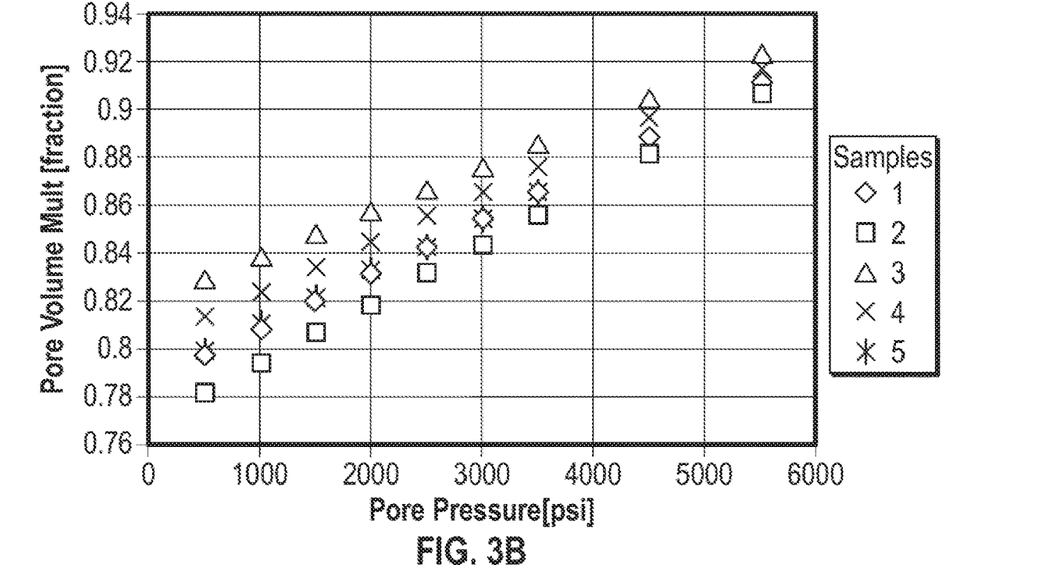
FIG. 3B is an illustrative graph showing changes in permeability as a function of confining stress for a number of rock samples.

In view of the foregoing generalized method, a more detailed description of the present disclosure will be provided with reference to FIG. 2, which is a flow chart of method 200 according to an illustrative embodiment of the present disclosure. At block 202, rock mechanics data is collected from pore compressibility test data. The rock mechanics data includes porosity and/or permeability data (also referred to herein as "property data") as a function of confining stress. FIG. 3A is an illustrative graph showing changes in porosity as a function of confining stress for a number of rock samples. FIG. 3B is an illustrative graph showing changes in permeability as a function of confining stress for a number of rock samples. The data in both FIGS. 3A and 3B were obtained from rock mechanics compressibility tests.

At block 204, the measured property data of block 202 is analyzed as a function of confining stress. Here, the computing system ensures the property data (porosity or permeability, for example) is represented as a fraction instead of a percentage. The associations between the property data and confining stress are also determined. Linear elasticity is assumed, therefore there must be a linear association between the rock mechanics property data and confining stress, but may have varying degrees of correlation, as illustrated in FIGS. 3A and 3B.

At block 206, the computing system performs DSPC on the confining stress data of block 202. Here, the computing system normalizes the maximum confining stress value to unity (i.e., to 1) and all other confining stress values to a value less than unity. Here, the confining stress values may be referred to as the normalized pressure response. At block 208, the computing system normalizes the property data measured as a function of confining stress in bock 202 to its respective porosity/permeability of greatest magnitude in the pore compressibility test. In this way, the maximum normalized porosity/permeability becomes unity and the measured porosity/permeability at the maximum confining stress becomes a value less than unity. The normalized porosity/permeability represents the respective "property multiplier." The property multiplier is the rescaling parameter that, when multiplied by the reference property value of unity, leads to a dimensional description of the of the intended property at a specific confining stress.

At block 210, the computing system mathematically projects the normalized stress response from block 206 so that it is symmetrically scaled above unity. The explanatory variable (i.e., the x-axis variable) is not considered converted from confining stress to pore pressure. Since it is symmetrically scaled above unity, the minimum pore pressure is unity and the maximum pore pressure is 2. This may be referred to as a symmetric normalized pressure response.

At block 212, the computing system plots the symmetric normalized pressure response from block 210 against the normalized porosity/permeability from block 208. Thereafter, the equation of the trendline describing the association between the predictor (pore pressure) and normalized pressure response variable (porosity/permeability) is computed. The trendline equation can be computed, for example, in a spreadsheet program by using endpoints in the plot to compute a slope and then inferring a y-intercept, as would be understood by those ordinarily skilled in the art having the benefit of this disclosure.

At block 214, the computing system reverses the range of the normalized pressure response in block 212 such that it is in ascending order. The computing system then rescales the range of the pore pressure so that the maximum value is unity. In certain illustrative methods, the computing system may perform this by subtracting the normalized pressure from the maximum pressure value of 2 in block 212.

At block 216, the computing system develops a rescale model of the property multiplier (porosity/permeability multiplier) from block 208 using the trendline from block 212. To achieve this in certain illustrative embodiments, substitution in the trendline of the reverse normalized pressure in block 214 is used to compute the property multiplier. In this way a trend based function of property multiplier versus reverse normalized pressure is obtained. This newly rescaled property multiplier is then plotted as a function of the reverse normalized pressure in block 214.

Figure 3C:
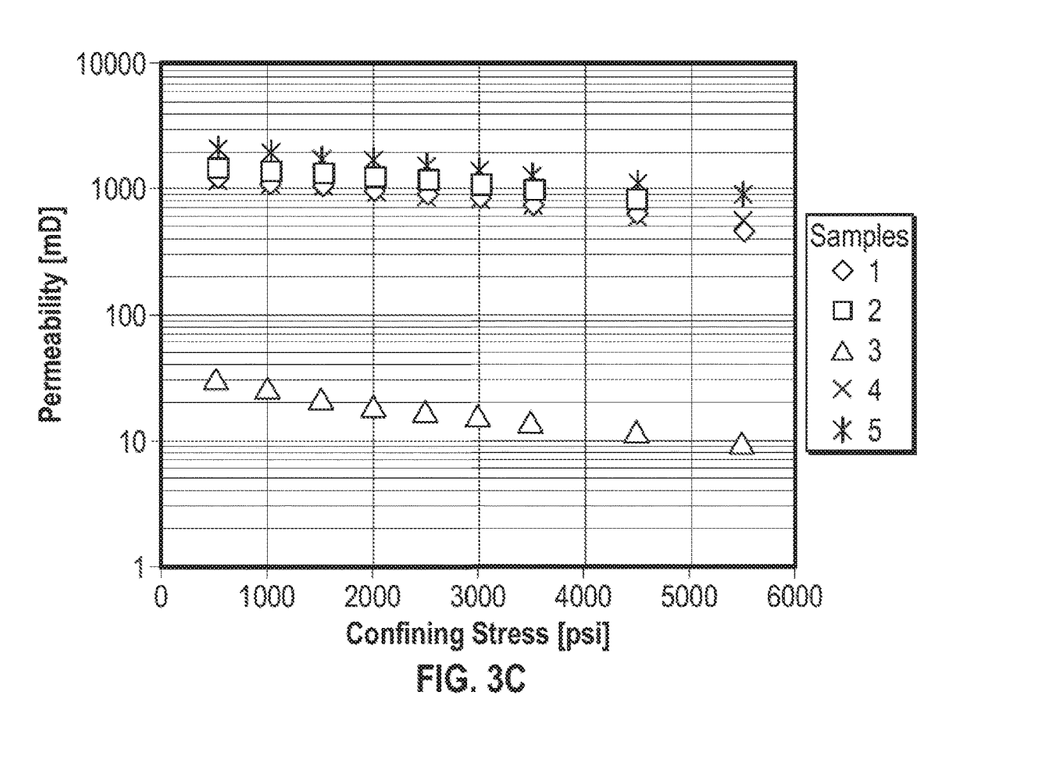
FIG. 3C is an illustrative plot of the pore volume multiplier computed as a function of pore pressure.
Figure 3D:
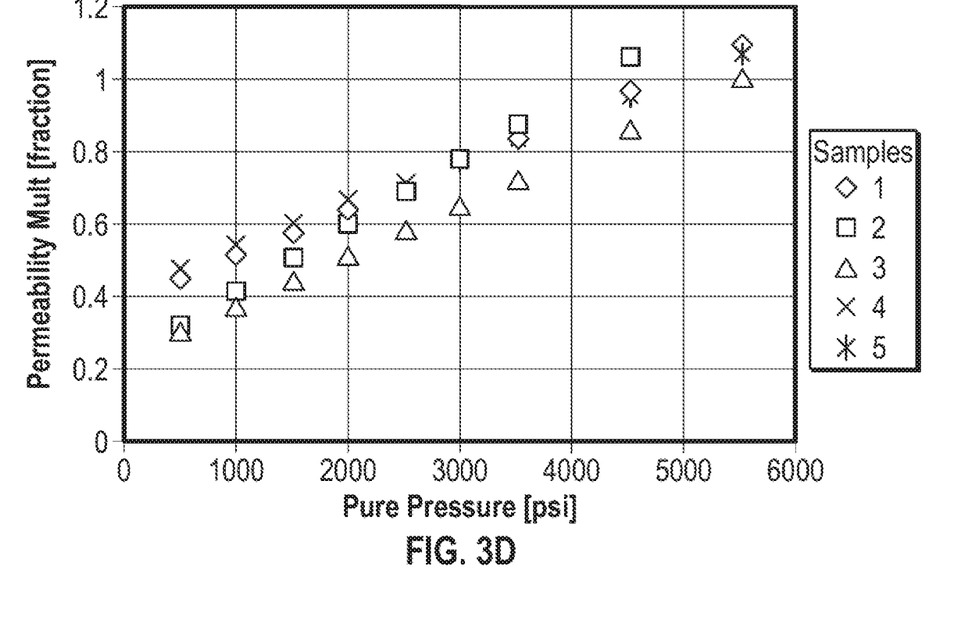
FIG. 3D is an illustrative plot of the permeability multiplier computed as a function of pore pressure.

Thereafter, at block 218, the computing system rescales the rescaled normalized pressure from block 214 to dimensional pressure. Here, in order to maintain the proper scaling of the property multiplier and normalized pressure, the computing system scales the slope of the trendline from block 216 according to the difference in minimum and maximum dimensional pressure. Thereafter, the computing system plots the property multiplier against the dimensional pore pressure. At block 220, the system executes a reservoir simulation using the dimensional pressure model. FIG. 3C is an illustrative plot of the pore volume, or porosity, multiplier computed as a function of pore pressure. FIG. 3D is an illustrative plot of the permeability multiplier computed as a function of pore pressure. FIGS. 3C and 3D are also referred to as rock compaction tables/curves.

The computing system may then output the rock compaction tables, which are tables characterized as dimensional property multipliers (e.g., pore volume, porosity, or permeability) as a function of pore pressure, as opposed to the original confining stress utilized in the rock mechanics test. The rock compaction tables may be utilized by the computing system to execute a reservoir simulation model that incorporates structural and hydrodynamic interaction resulting from hydrocarbon production, for example, via a user computing workstation, cluster or cloud computing network. The reservoir model may be used to analyze or predict well production for a given well, or to evaluate production drive mechanisms of a planned or operating well.

Figure 4A:
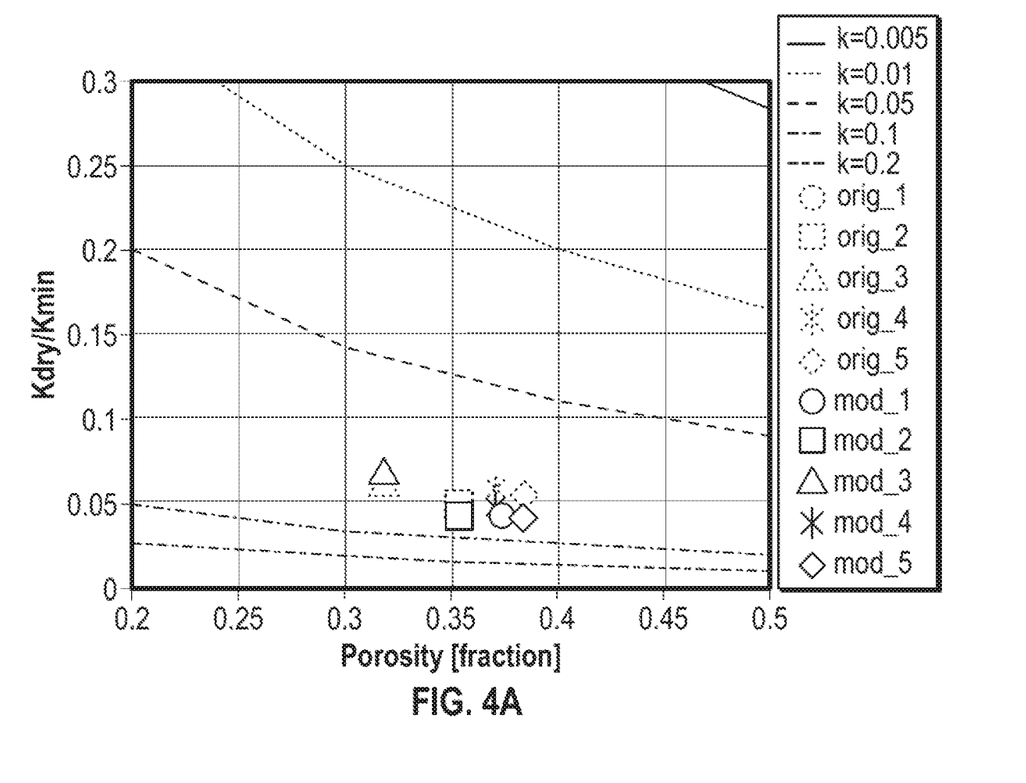
FIG. 4A is a plot showing the dry rock/mineral bulk modulus ratio computed for original and modeled rock mechanics data of the present disclosure, providing validation of the illustrative methods.

As previously mentioned, in certain illustrative methods, the generated reservoir model may be validated by evaluating whether the modeled property multipliers, created as a function of pore pressure, converge into the same family of pore space/mineral bulk modulus ratio. FIG. 4A is a plot of this validation, showing the dry rock/mineral bulk modulus ratio computed for original and modeled rock mechanics data. Note FIG. 4A only shows porosity and the dry rock/mineral bulk modulus ratio. Note the dry rock/mineral bulk modulus ratio computed for the rock mechanics lab data are computed as a function of confining stress (orig) and the modeled rock property multipliers (mod) are computed as a function of pore pressure. Constant lines of the pore space/mineral bulk modulus ratio are provided as validation that the modeled properties are coincident with the original lab data. Small differences in association between measured and model data indicate higher degree of model accuracy, while large differences indicate poor model quality. As illustrated in FIG. 4A, the small differences between original rock mechanics lab data on the modeled pore pressure data, highlights the accuracy of the model generated using the illustrative methods provided herein.

In one or more illustrative embodiments, a visual representation of various plots and reservoir models may be displayed to a user via a GUI of a reservoir simulation application executable at the user's computing device. Such a computing device may be implemented using any type of device having one or more processors, a user input (e.g., a mouse, QWERTY keyboard, touch-screen, a graphics tablet, or microphone), a display, and a communications infrastructure capable of receiving and transmitting data over a network. An example of such a computing device will be described in further detail below with respect to FIG. 5.

Figure 5:
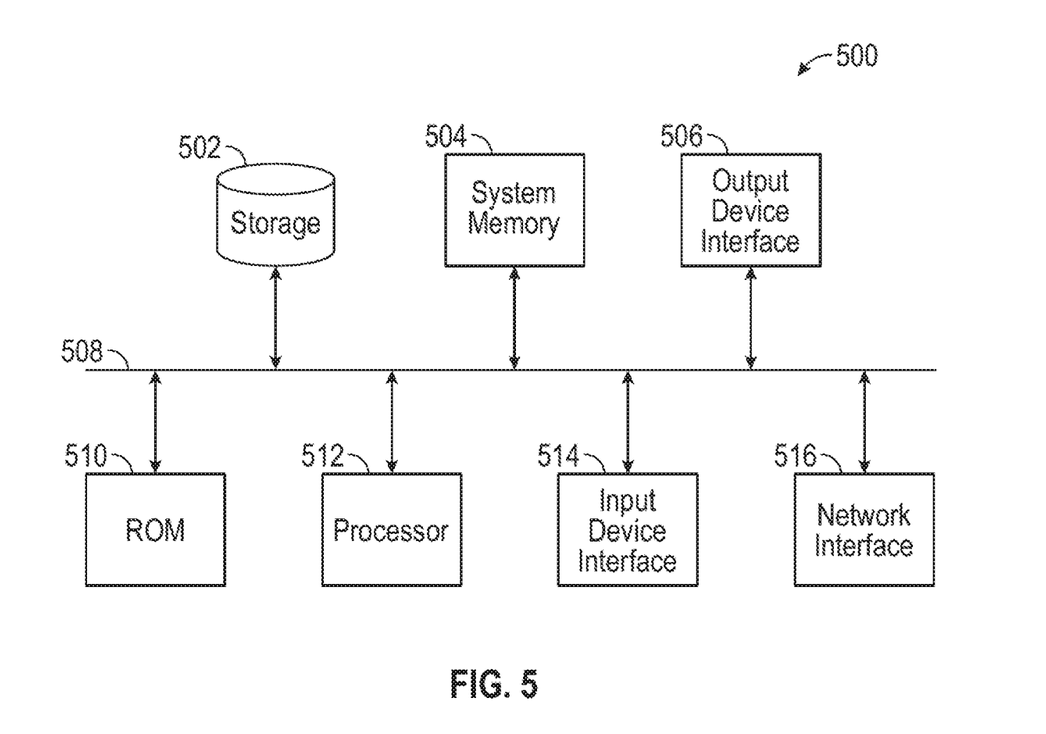
FIG. 5 is a block diagram illustrating an example of a computer system in which embodiments of the present disclosure may be implemented.

FIG. 5 is a block diagram illustrating an example of a computing system 500 in which embodiments of the present disclosure may be implemented. For example, methods 100 or 200 of FIGS. 1 and 2, as described above, may be implemented using system 500. System 500 can be a computer, phone, PDA, or any other type of electronic device. Such an electronic device includes various types of computer readable media and interfaces for various other types of computer readable media. As shown in FIG. 5, system 500 includes a permanent storage device 502, a system memory 504, an output device interface 506, a system communications bus 508, a read-only memory ("ROM") 510, processing unit(s) 512, an input device interface 514, and a network interface 516.

Bus 508 collectively represents all system, peripheral, and chipset buses that communicatively connect the numerous internal devices of system 500. For instance, bus 508 communicatively connects processing unit(s) 512 with ROM 710, system memory 504, and permanent storage device 502. From these various memory units, processing unit(s) 512 retrieves instructions to execute and data to process in order to execute the processes of the subject disclosure. The processing unit(s) can be a single processor or a multi-core processor in different implementations.

ROM 510 stores static data and instructions that are needed by processing unit(s) 512 and other modules of system 500. Permanent storage device 502, on the other hand, is a read-and-write memory device. This device is a non-volatile memory unit that stores instructions and data even when system 500 is off. Some implementations of the subject disclosure use a mass-storage device (such as a magnetic or optical disk and its corresponding disk drive) as permanent storage device 502.

Other implementations use a removable storage device (such as a floppy disk, flash drive, and its corresponding disk drive) as permanent storage device 502. Like permanent storage device 502, system memory 504 is a read-and-write memory device. However, unlike storage device 502, system memory 504 is a volatile read-and-write memory, such a random access memory. System memory 504 stores some of the instructions and data that the processor needs at runtime. In some implementations, the processes of the subject disclosure are stored in system memory 504, permanent storage device 502, and/or ROM 510. From these various memory units, processing unit(s) 512 retrieves instructions to execute and data to process in order to execute the processes of some implementations.

Bus 508 also connects to input and output device interfaces 514 and 506. Input device interface 514 enables the user to communicate information and select commands to the system 500. Input devices used with input device interface 514 include, for example, alphanumeric, QWERTY, or T9 keyboards, microphones, and pointing devices (also called "cursor control devices"). Output device interfaces 506 enables, for example, the display of images generated by the system 500. Output devices used with output device interface 506 include, for example, printers and display devices, such as cathode ray tubes ("CRT") or liquid crystal displays ("LCD"). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 5, bus 508 also couples system 500 to a public or private network (not shown) or combination of networks through a network interface 516. Such a network may include, for example, a local area network ("LAN"), such as an Intranet, or a wide area network ("WAN"), such as the Internet. Any or all components of system 500 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs ("CD-ROM"), recordable compact discs ("CD-R"), rewritable compact discs ("CD-RW"), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits ("ASICs") or field programmable gate arrays ("FPGAs"). In some implementations, such integrated circuits execute instructions that are stored on the circuit itself. Accordingly, methods 100 or 200, as described above, may be implemented using system 500 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a LAN and a WAN, an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of exemplary approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Accordingly, the illustrative embodiments described herein provide improved reservoir simulation models generated using rock compaction tables that express changes in geomechanical processes of reservoirs due to pore pressure. This is advantageous because pore pressure is modeled in the reservoir simulator; confining stress is not. If the porosity/pore volume/permeability are not expressed as functions of pore pressure, there would be no way to model their changes in the reservoir simulator. A number of other advantages are provided by the current disclosure. It provides: a reproducible method for computing rock property variations as a function of pore pressure given data measured according to confining stress; intrinsic rock property consideration when building rock compaction tables for modeling pore volume compressibility in reservoir simulations; it promotes: the existing rock compaction modeling capability as a function of pore pressure in Nexus®; the ability to identify 4D anomalies attributed (like stress arching) to changes in saturated rock properties using reservoir simulation in the absence of a coupled geomechanics model; and it increases accuracy while maintaining a simplified approach to modeling rock compaction in a reservoir simulation model. Moreover, the end-user cost of acquiring additional pore pressure based rock mechanics test data is negated and the time to acquire the rock mechanics data is short, thus the present disclosure can be easily incorporated into existing workflows without significant burden to end users.

Embodiments and methods of the present disclosure described herein further relate to any one or more of the following paragraphs:

1. A computer-implemented reservoir simulation method, comprising obtaining rock mechanics data from a pore compressibility test, the rock mechanics data being expressed as a function of confining stress; converting the rock mechanics data from a function of confining stress to a function of pore pressure using dimensionless stress to pore pressure conversion ("DSPC"); generating one or more rock compaction tables using the converted rock mechanics data; and inputting data from the rock compaction table into a reservoir simulator to thereby generate a reservoir model, wherein the reservoir model may be used to evaluate well production.

2. The computer-implemented method as defined in paragraph 1, wherein porosity or permeability data as a function of confining stress is obtained from the rock mechanics data.

3. The computer-implemented method as defined in paragraphs 1 or 2, wherein the reservoir model simulates changes in the converted rock mechanics data generated as a function of confining stress into expressions of changes in the reservoir simulation due to pore pressure.

4. The computer-implemented method as defined in any of paragraphs 1-3, wherein converting the rock mechanics data to a function of pore pressure comprises determining an assumed linear association that is determined to exist between the rock mechanics data and confining stress, the rock mechanics data being comprised of porosity or permeability data; representing the rock mechanics data as a fraction; using DSPC, normalizing the rock mechanics data such that a maximum confining stress value is equal to 1 and all other confining stress values are less than 1, wherein the confining stress values represent a normalized stress response; using DSPC, normalizing the rock mechanics data such that a maximum porosity and permeability value is equal to 1 and a porosity and permeability value at the maximum confining stress value is less than 1, wherein the normalized porosity and permeability values represent porosity and permeability multipliers; projecting the normalized stress response to be symmetrical above 1, thereby converting from confining stress to pore pressure wherein pore pressure values represent a normalized pressure response; plotting the symmetric normalized pressure response against the normalized porosity and permeability values, and computing an equation of a trendline describing an association between the symmetric normalized pressure response and normalized porosity and permeability values; rescaling a range of the symmetric normalized pressure response such that the maximum pore pressure value is equal to 1; using the trendline, generating a rescale model of the porosity and permeability multipliers; rescaling the rescaled range of the symmetric normalized pressure response to dimensionless pore pressure using DSPC; and plotting the rescaled porosity and permeability multipliers against the dimensionless pore pressure, thereby representing compaction tables which can be included in the execution of a reservoir model to relate changes in pore pressure to multipliers which effect porosity or permeability of a subsurface system being modeled.

5. The computer-implemented method as defined in any of paragraphs 1-4, wherein the reservoir model is used to predict well production or evaluate production drive mechanisms.

6. A system for simulating a reservoir, the system comprising non-transitory memory storing rock mechanics data; and one or more hardware processors coupled to the non-transitory memory and configured to execute instructions to cause the system to perform operations comprising: obtaining rock mechanics data from a pore compressibility test, the rock mechanics data being expressed as a function of confining stress; converting the rock mechanics data from a function of confining stress to a function of pore pressure using dimensionless stress to pore pressure conversion ("DSPC"); generating one or more rock compaction tables using the converted rock mechanics data; and inputting data from the rock compaction table into a reservoir simulator to thereby generate a reservoir model, wherein the reservoir model may be used to perform wellbore operations.

7. The system as defined in paragraph 6, wherein porosity or permeability data as a function of confining stress is obtained from the rock mechanics data.

8. The system as defined in paragraphs 6 or 7, wherein the reservoir model simulates changes in the converted rock mechanics data generated as a function of confining stress into expressions of changes in the reservoir simulation due to pore pressure.

9. The system as defined in any of paragraphs 6-8, wherein converting the rock mechanics data to a function of pore pressure comprises determining an assumed linear association that is determined to exist between the rock mechanics data and confining stress, the rock mechanics data being comprised of porosity or permeability data; representing the rock mechanics data as a fraction; using DSPC, normalizing the rock mechanics data such that a maximum confining stress value is equal to 1 and all other confining stress values are less than 1, wherein the confining stress values represent a normalized stress response; using DSPC, normalizing the rock mechanics data such that a maximum porosity and permeability value is equal to 1 and a porosity and permeability value at the maximum confining stress value is less than 1, wherein the normalized porosity and permeability values represent porosity and permeability multipliers; projecting the normalized stress response to be symmetrical above 1, thereby converting from confining stress to pore pressure wherein pore pressure values represent a normalized pressure response; plotting the symmetric normalized pressure response against the normalized porosity and permeability values, and computing a trendline describing an association between the symmetric normalized pressure response and normalized porosity and permeability values; rescaling a range of the symmetric normalized pressure response such that the maximum pore pressure value is equal to 1; using the trendline, generating a rescale model of the porosity and permeability multipliers; rescaling the rescaled range of the symmetric normalized pressure response to dimensionless pore pressure using DSPC; and plotting the rescaled porosity and permeability multipliers against the dimensionless pore pressure, thereby representing compaction tables which can be included in the execution of a reservoir model to relate changes in pore pressure to multipliers which effect porosity or permeability of a subsurface system being modeled.

10. The system as defined in any of paragraphs 6-9, wherein the reservoir model is used to predict production from wells or evaluate production drive mechanisms.

Furthermore, the illustrative methods described herein may be implemented by a system comprising processing circuitry or a non-transitory computer readable medium comprising instructions which, when executed by at least one processor, causes the processor to perform any of the methods described herein.

Although various embodiments and methods have been shown and described, the present disclosure is not limited to such embodiments and methods and will be understood to include all modifications and variations as would be apparent to one skilled in the art. Therefore, it should be understood that this disclosure is not intended to be limited to the particular forms disclosed. Rather, the intention is to cover all modifications, equivalents and alternatives falling within the spirit and scope of the disclosure as defined by the appended claims.

What is claimed is:

1. A computer-implemented method for reservoir simulation, the method comprising:
   performing a pore compressibility test on a reservoir rock sample;
   obtaining, by a computing device, rock mechanics data from the pore compressibility test performed on the reservoir rock sample, wherein the rock mechanics data includes confining stress values measured for the reservoir rock sample during the pore compressibility test;
   converting, by the computing device, the rock mechanics data from a function of confining stress to a function of pore pressure using dimensionless stress to pore pressure conversion ("DSPC"), wherein the confining stress values included in the rock mechanics data are converted to corresponding pore pressure values;

generating, by the computing device, a reservoir model based on the converted rock mechanics data;

simulating, by the computing device, geomechanical changes in the reservoir rock sample based on the generated reservoir model; and predicting, by the computing device, well production, based on the simulation.

2. The computer-implemented method as defined in claim 1, wherein the confining stress values in the rock mechanics data include porosity and permeability values measured at varying confining stresses during the pore compressibility test.

3. The computer-implemented method as defined in claim 2, wherein the reservoir model is used in the simulation to transform the geomechanical changes in the reservoir rock sample from expressions of confining stress into expressions of pore pressure.

4. The computer-implemented method as defined in claim 3, wherein converting the rock mechanics data to a function of pore pressure comprises:

determining an assumed linear association that is determined to exist between the rock mechanics data and confining stress;

representing the rock mechanics data as a fraction;

using DSPC, normalizing the rock mechanics data such that a maximum confining stress value is equal to 1 and all other confining stress values are less than 1, wherein the confining stress values represent a normalized stress response;

using DSPC, normalizing the rock mechanics data such that a maximum porosity and permeability value is equal to 1 and the porosity and permeability values at the maximum confining stress value is less than 1, wherein the normalized porosity and permeability values represent porosity and permeability multipliers;

projecting the normalized stress response to be symmetrical above 1, thereby converting from confining stress to pore pressure wherein pore pressure values represent a normalized pressure response;

plotting the symmetric normalized pressure response against the normalized porosity and permeability values, and computing an equation of a trendline describing an association between the symmetric normalized pressure response and normalized porosity and permeability values;

resealing a range of the symmetric normalized pressure response such that the maximum pore pressure value is equal to 1;

using the trendline, generating a rescale model of the porosity and permeability multipliers;

resealing the resealed range of the symmetric normalized pressure response to dimensionless pore pressure using DSPC; and plotting the resealed porosity and permeability multipliers against the dimensionless pore pressure, thereby representing compaction tables which can be included in the execution of the reservoir model to relate changes in pore pressure to multipliers which effect porosity or permeability of a subsurface system being modeled.

5. The computer-implemented method as defined in claim 1, further comprising evaluating production drive mechanisms, based on the simulation.

6. A system for simulating a reservoir, the system comprising:

non-transitory memory storing rock mechanics data; and one or more hardware processors coupled to the non-transitory memory and configured to execute instructions to cause the system to perform operations comprising:

obtaining rock mechanics data from a pore compressibility test performed on a reservoir rock sample, wherein the rock mechanics data includes confining stress values measured for the reservoir rock sample during the pore compressibility test;

converting the rock mechanics data from a function of confining stress to a function of pore pressure using dimensionless stress to pore pressure conversion ("DSPC"), wherein the confining stress values included in the rock mechanics data are converted to corresponding pore pressure values;

generating a reservoir model based on the converted rock mechanics data;

simulating geomechanical changes in the reservoir rock sample based on the generated reservoir model; and predicting well production, based on the simulation.

7. The system as defined in claim 6, wherein the confining stress values in the rock mechanics data include porosity and permeability values measured at varying confining stresses during the pore compressibility test.

8. The system as defined in claim 7, wherein the reservoir model is used in the simulation to transform the geomechanical changes in the reservoir rock sample from expressions of confining stress into expressions of pore pressure.

9. The system as defined in claim 8, wherein converting the rock mechanics data to a function of pore pressure comprises:

determining an assumed linear association that is determined to exist between the rock mechanics data and confining stress;

representing the rock mechanics data as a fraction;

using DSPC, normalizing the rock mechanics data such that a maximum confining stress value is equal to 1 and all other confining stress values are less than 1, wherein the confining stress values represent a normalized stress response;

using DSPC, normalizing the rock mechanics data such that a maximum porosity and permeability value is equal to 1 and the porosity and permeability values at the maximum confining stress value is less than 1, wherein the normalized porosity and permeability values represent porosity and permeability multipliers;

projecting the normalized stress response to be symmetrical above 1, thereby converting from confining stress to pore pressure wherein pore pressure values represent a normalized pressure response;

plotting the symmetric normalized pressure response against the normalized porosity and permeability values, and computing a trendline describing an association between the symmetric normalized pressure response and normalized porosity and permeability values;

rescaling a range of the symmetric normalized pressure response such that the maximum pore pressure value is equal to 1;

using the trendline, generating a rescale model of the porosity and permeability multipliers;

rescaling the rescaled range of the symmetric normalized pressure response to dimensionless pore pressure using DSPC; and plotting the rescaled porosity and permeability multipliers against the dimensionless pore pressure, thereby representing compaction tables which can be included in the execution of the reservoir model to relate changes in pore pressure to multipliers which effect porosity or permeability of a subsurface system being modeled.

10. The system as defined in claim 6, wherein the operations performed by the system further include evaluating production drive mechanisms.

11. A non-transitory computer-readable medium comprising instructions which, when executed by a processor, causes the processor to perform operations comprising:
   obtaining rock mechanics data from a pore compressibility test performed on a reservoir rock sample, wherein the rock mechanics data includes confining stress values measured for the reservoir rock sample during the pore compressibility test;
   converting the rock mechanics data from a function of confining stress to a function of pore pressure using dimensionless stress to pore pressure conversion ("DSPC"), wherein the confining stress values included in the rock mechanics data are converted to corresponding pore pressure values;
   generating reservoir model based on the converted rock mechanics data;
   simulating geomechanical changes in the reservoir rock sample based on the generated reservoir model; and
   predicting well production, based on the simulation.

12. The computer-readable medium as defined in claim 11, wherein the confining stress values in the rock mechanics data include porosity and permeability values measured at varying confining stresses during the pore compressibility test.

13. The computer-readable medium as defined in claim 12, wherein the reservoir model is used in the simulation to transform the geomechanical changes in the reservoir rock sample from expressions of confining stress into expressions of pore pressure.

14. The computer-readable medium as defined in claim 13, wherein converting the rock mechanics data to a function of pore pressure comprises:
   determining an assumed linear association that is determined to exist between the rock mechanics data and confining stress;
   representing the rock mechanics data as a fraction;
   using DSPC, normalizing the rock mechanics data such that a maximum confining stress value is equal to 1 and all other confining stress values are less than 1, wherein the confining stress values represent a normalized stress response;
   using DSPC, normalizing the rock mechanics data such that a maximum porosity and permeability value is equal to 1 and the porosity and permeability values at the maximum confining stress value is less than 1, wherein the normalized porosity and permeability values represent porosity and permeability multipliers;
   projecting the normalized stress response to be symmetrical above 1, thereby converting from confining stress to pore pressure wherein pore pressure values represent a normalized pressure response;
   plotting the symmetric normalized pressure response against the normalized porosity and permeability values, and computing an equation of a trendline describing an association between the symmetric normalized pressure response and normalized porosity and permeability values;
   rescaling a range of the symmetric normalized pressure response such that the maximum pore pressure value is equal to 1;
   using the trendline, generating a rescale model of the porosity and permeability multipliers;
   rescaling the rescaled range of the symmetric normalized pressure response to dimensionless pore pressure using DSPC; and
   plotting the rescaled porosity and permeability multipliers against the dimensionless pore pressure, thereby representing compaction tables which can be included in the execution of the reservoir model to relate changes in pore pressure to multipliers which effect porosity or permeability of a subsurface system being modeled.

15. The computer-readable medium as defined in claim 11, wherein the operations performed by the processor further comprise evaluating production drive mechanisms, based on the simulation.

* * * * *